(12) United States Patent
Chang et al.

(10) Patent No.: US 11,355,564 B2
(45) Date of Patent: Jun. 7, 2022

(54) AMOLED AND MICRO-OLED FOR AUGMENTED REALITY AND AUTOSTEREOSCOPIC 3D DISPLAYS

(71) Applicants: AROLLTECH CO., LTD., Grand Cayman (KY); ETCH HOME TECHNOLOGY CO., LTD., Taoyuan (TW)

(72) Inventors: Yih Chang, New Taipei (TW); Yusheng Chang, New Taipei (TW); Tsung Jen Kuo, Taoyuan (TW)

(73) Assignee: AROLLTECH CO., LTD., Grand Cayman (KY)

( * ) Notice: Subject to any disclaimer, the term of this patent is extended or adjusted under 35 U.S.C. 154(b) by 152 days.

(21) Appl. No.: 16/702,942

(22) Filed: Dec. 4, 2019

(65) Prior Publication Data
US 2021/0175307 A1    Jun. 10, 2021

(51) Int. Cl.
| H01L 27/32 | (2006.01) |
| H01L 51/52 | (2006.01) |
| H01L 51/54 | (2006.01) |
| H01L 51/00 | (2006.01) |
| H01L 51/56 | (2006.01) |

(52) U.S. Cl.
CPC ........ H01L 27/3253 (2013.01); H01L 27/322 (2013.01); H01L 27/3276 (2013.01); H01L 51/0096 (2013.01); H01L 2227/323 (2013.01)

(58) Field of Classification Search
CPC ............... H01L 27/322; H01L 27/3251; H01L 27/3253; H01L 27/3276; H01L 51/0096; H01L 2227/323; Y02E 10/549
See application file for complete search history.

(56) References Cited

U.S. PATENT DOCUMENTS

| 10,166,749 | B2 | 1/2019 | Suga et al. | |
| 2004/0036410 | A1* | 2/2004 | Park | H01L 27/322 |
| | | | | 313/504 |
| 2007/0145887 | A1* | 6/2007 | Chae | H01L 27/3253 |
| | | | | 313/504 |
| 2015/0301422 | A1* | 10/2015 | Miyake | G06F 3/0412 |
| | | | | 349/38 |

(Continued)

OTHER PUBLICATIONS

Chang-Wook Han, Hwa Kyung Kim, Hee Suk Pang, Sung-Hoon Pieh, Chang Je Sung, Hong Seok Choi, Woo-Chan Kim, Myung-Seop Kim, and Yoon-Heung Tak, Dual-plate OLED display (DOD) embedded with white OLED, Journal of Display Technology, vol. 5, No. 12, Dec. 2009; pp. 1-6.

(Continued)

Primary Examiner — Mary A Wilczewski
(74) Attorney, Agent, or Firm — Muncy, Geissler, Olds & Lowe, P.C.

(57) ABSTRACT

An OLED device includes: a first substrate having a bonding surface; a second substrate having a first surface; a coloring unit including an OLED layer and optionally a color-transformation layer, the OLED layer being formed on a selected one of the first and second substrates, the color-transformation layer being formed on the second substrate; and a pixel circuit with TFT functions disposed on the first substrate and coupled to the OLED layer. The bonding surface of the first substrate and the first surface of the second substrate are in direct bonding.

8 Claims, 9 Drawing Sheets

(56) References Cited

U.S. PATENT DOCUMENTS

| | | | | |
|---|---|---|---|---|
| 2015/0318339 A1* | 11/2015 | Nakamura | ........... | H01L 51/5234 |
| | | | | 257/98 |
| 2016/0372528 A1* | 12/2016 | Kamura | .............. | H01L 27/3211 |
| 2018/0039117 A1* | 2/2018 | Ikeda | ................. | G02F 1/133526 |
| 2019/0115546 A1* | 4/2019 | Lu | ......................... | H01L 51/5215 |
| 2020/0219935 A1* | 7/2020 | Ahn | ...................... | H01L 51/525 |
| 2020/0266244 A1* | 8/2020 | Kim | .................... | H01L 27/3206 |
| 2021/0159461 A1* | 5/2021 | Nakamura | ............. | H05B 33/12 |
| 2021/0175307 A1* | 6/2021 | Chang | ................... | H01L 27/322 |

OTHER PUBLICATIONS

Chang-Wook Han (SID Member), Yoon-Heung Tak, In Byeong Kang, Byung-Chul Ahn (SID Member), In Jae Chung (SID Member), Dual-plate OLED display (DOD) based on amorphous-silicon (a-Si) TFT backplane, Journal of the SID 17/2, 2009; pp. 1-7.

Amalkumar P. Ghosh, Tariq A. Ali, Ilyas Khayrullin, Fridrich Vazan, Olivier F. Prache, Ihor Wacyk eMagin Corporation, 2070 Route 52, Hopewell Junction, NY 12533, Recent advances in small molecule OLED-on-silicon microdisplays, Aug. 2009; pp. 1-13.

H Moriceau1, F Rieutord2, F Fournel1, Y Le Tiec1, L Di Cioccio1, C Morales1, A M Charvet1 and C Deguet1, Overview of recent direct wafer bonding advances and applications, Feb. 1, 2011; pp. 1-12.

EMagin Exhibits 2k x 2k OLED Micro-display, Jul. 10, 2017; pp. 1.

Yi Chang, Micro OLED (mOLED), New Micro-OLED Device, Aug. 8, 2019; pp. 1-3.

* cited by examiner

AMOLED AND MICRO-OLED FOR AUGMENTED REALITY AND AUTOSTEREOSCOPIC 3D DISPLAYS

TECHNICAL FIELD

The present disclosure relates to an organic light emitting diode (OLED) device, and more particularly to an OLED device with an architecture capable of realizing the next wave display applications.

DISCUSSION OF THE BACKGROUND

Currently, active-matrix OLED (AMOLED) displays, are widely used in electronic devices. AMOLED normally includes an OLED layer formed directly on a TFT (thin film transistor) substrate and driven by TFTs on the substrate that control the light emission of each sub-pixel of the OLED layer. Among the AMOLED displays, the micro-OLED (µOLED) has drawn much attention in the OLED industries for its promising applications in the next wave virtual reality (VR), mixed reality (MR), augmented reality (AR), and autostereoscopic (naked-eye) 3D displays. The resolution and brightness are two most critical parameters for the µOLED device in realizing the next wave virtual display industries. In order to meet the specification of the next wave virtual displays, the µOLED is required to have a resolution beyond 2,000 pixels per inch (ppi) and a brightness above 5,000 nits ($cd/m^2$) for AR applications and beyond 100,000 nits for autostereoscopic 3D displays. The current commercial µOLED uses a silicon wafer as a substrate for forming basic functional components thereon and has a resolution of about 500 to 2,000 ppi and a brightness of about 150 to 1,000 nits. However, the existing µOLED is very difficult to manufacture with a very low yield due to the integration of the CMOS (which has some of the functions same as those of the TFT in AMOLED), the white OLED, the color filter (CF), and thin film encapsulating layers onto one single Si substrate, in which the white OLED is formed on the TFT, then the thin film encapsulating layers are formed on the white OLED, and finally the CF is directly deposited on the thin film encapsulating layers. Therefore, there is a need to provide a new type of AMOLED display to address the above low yield issue.

Moreover, for some present and next-wave AR/MR virtual display applications, the µOLED with resolution beyond 2,000 pixels per inch (ppi) and brightness above 5,000 nits ($cd/m^2$) will be required in order to meet future product demands. However, the existing µOLED with CF as the color transformation layer to transform the white light emitted from underlying white OLED to red, green, and blue colors is very difficult to reach and vulnerable to such high brightness. The future µOLED for AR/MR applications is required to be able to emit higher RGB brightness to reach the contrast high enough to overcome the various environment light scattering without head mount to block the background brightness. The AR/MR also needs higher resolution than that of VR due to the digital virtual image combined with real image which has much higher resolution than the virtual image generated from the image same as mobile phone or notebook. There are more critical requirements for µOLED to project the full-color images in the imaging plane with brightness to reach beyond 100,000 nits for autostereoscopic 3D displays under normal indoor environment in order to successfully display the real 3D stereographic images in front of the human naked eyes without any goggles with image brightness of 1,000 nits and contrast ratio greater than 100. Therefore, there is a need to provide a new type of µOLED to address the above issue.

FIGS. 1 and 2 illustrate the architecture of a conventional µOLED device. The µOLED device includes a printed circuit board (PCB) 80, a silicon die 81 attached to the PCB 80, and a cover glass 82 covering the silicon die 81 with inside attached desiccant to prevent the moisture and oxygen from attacking OLED device. The silicon die 81 includes a Si substrate 811, a CMOS layer 812 formed on the Si substrate 811, a white OLED 813 formed on the CMOS layer 812, a seal layer 814 covering the white OLED 813, and a CF 815 formed on the seal layer 814. The white OLED 813 includes a pixel electrode 8131 (an anode), a hole injection layer (HIL) 8132, a hole transport layer (HTL) 8133, a white emission layer (EML) 8134, an electron transport layer (ETL) 8135, and a transparent cathode 8136.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides an OLED device. The OLED device includes: a first substrate having a bonding surface; a second substrate having a first surface; a coloring unit including an OLED layer and optionally a color-transformation layer, the OLED layer being formed on a selected one of the first and second substrates, the optional color-transformation layer being formed on the second substrate; and a pixel circuit with pixel driving and controlling functions formed on the first substrate and coupled to the OLED layer for controlling emission of each sub-pixel of the OLED device. The bonding surface of the first substrate and the first surface of the second substrate are in direct bonding.

The foregoing has outlined rather broadly the features and technical advantages of the present disclosure in order that the detailed description of the disclosure that follows may be better understood. Additional features and technical advantages of the disclosure are described hereinafter and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
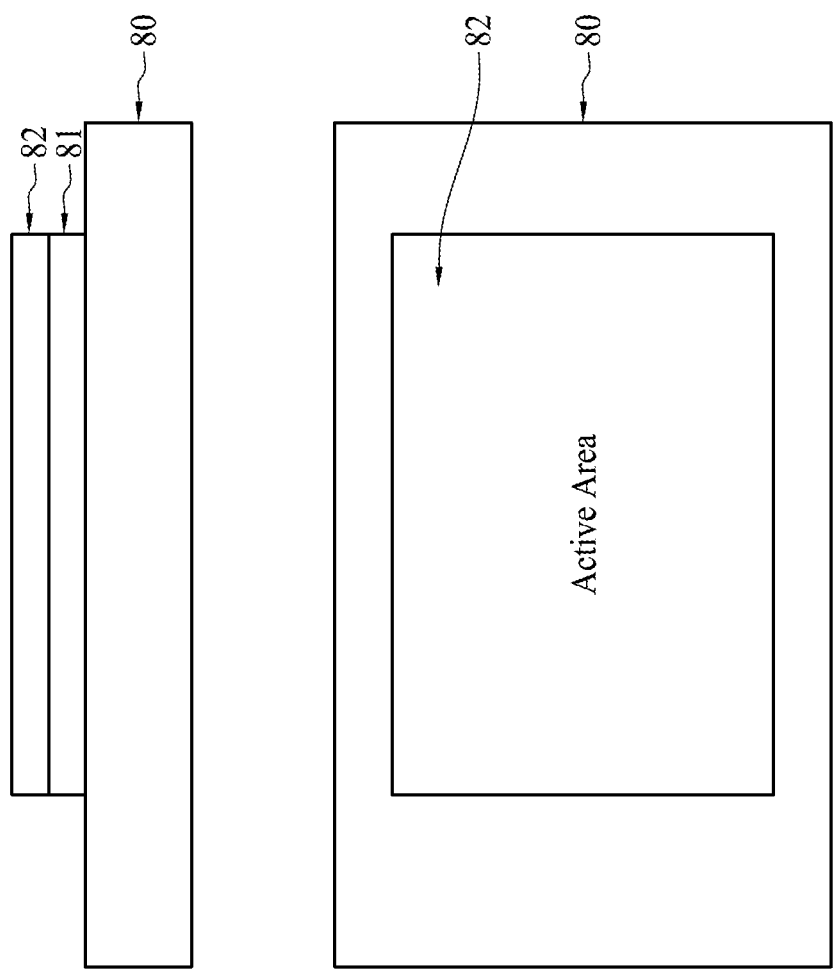
FIG. 1 is a drawing schematically showing top and side views of a conventional µOLED device.
Figure 2:
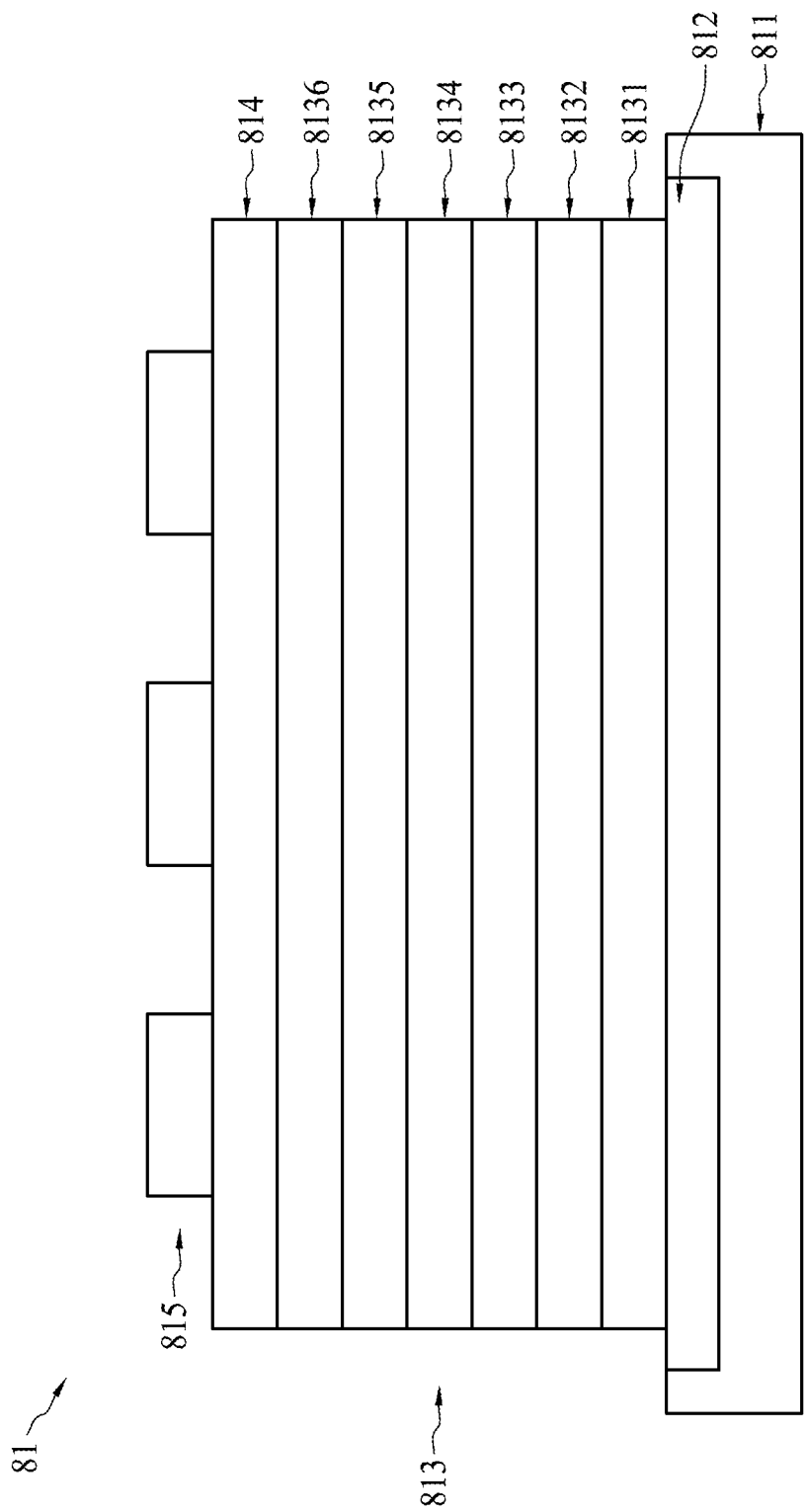
FIG. 2 is a schematic view of the OLED layer of the conventional µOLED device.

Embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness of features may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearance of the phrases "in some embodiments" or "in an embodiment" in various places throughout this specification does not necessarily refer to the same embodiment. Further more, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific ter ns) used herein have the same meanings as those commonly understood by a person having ordinary skill in the art to which the embodiments of the present disclosure belong. It should be understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

As display technology has evolved, displays have included the cathode ray tube (CRT), the liquid-crystal display (LCD), the light-emitting diode (LED), and, more recently, the OLEDs, in particular the active-matrix organic light-emitting diode (AMOLED). In recent years, since an AMOLED provides a superior form factor, self-emitting capability, lighter weight, and a better performance, such as a short response time, AMOLED has replaced LCD as the main approach to display technology.

However, AMOLED may no longer be able to meet requirement of new applications, such as virtual reality (VR), augmented reality (AR), mixed reality (MR), and 3D holography. These new applications generally require higher frame rates (for example, greater than about 128 frames per second (fps)), greater brightness (above 1,000 nits), and extremely high resolution (for example, greater than 2,000 pixels per inch, ppi). The reasons for which AMOLED may no longer be able to meet requirements are briefly summarized below.

An AMOLED is mainly composed of an OLED front plane and a thin-film transistor (TFT) substrate (alternatively referred to as a backplane substrate). The OLED front plane is directly formed on the TFT substrate, and functions to emit light while being driven. The TFT substrate functions to drive the OLED front plane. Generally, the TFT substrate is a glass substrate and includes a plurality of transistors, capacitors, and other active or passive electrical components formed on the glass substrate. The transistors include switching transistors and driving transistors. In some examples, the transistors include a p-channel metal-oxide-transistor (MOS) (PMOS), an n-channel MOS (NMOS), or a complementary MOS (CMOS). Generally, the transistors and the capacitors in combination function to drive a sub-pixel of the OLED front plane. However, in Si semiconductor industries, these transistors are normally made by CMOS since the CMOS is a fundamental building block and is well developed down to nanometer scale design rules. In this invention, a sub-pixel circuit with the TFT function is defined as one that has a plurality of transistors, which include scanning and driving transistors and optionally compensation transistors, capacitors, and other active or passive electrical components, and is used to drive each sub-pixel of the OLED device. In Si wafer terminology, this TFT is replaced by CMOS, whereas, in the AMOLED display with the glass substrate, the term "TFT" is used. Hence, as described above, the sub-pixel circuit of TFT represents the TFT function formed on the glass substrate, whereas, the sub-pixel circuit of CMOS represents the TFT function formed on the Si wafer.

An LCD display is normally driven by a TFT circuit with 2 transistors and 1 capacitor on a TFT substrate because the LCD is a voltage driven device with a high voltage applied to turn on the liquid crystal to align to the light emitted from the backlight beneath the TFT substrate. These two transistors include one switching transistor and one driving transistor accompanied with one capacitor to store the electrical charge to maintain the voltage high enough to turn on the liquid crystal to align in a direction parallel to the light. In contrast, an OLED is a current driven self-emitting device. In order to overcome the current uniformity of each sub-pixel and at the same time to adjust the threshold voltage shift due to unstable underlying gate channel made from amorphous-Si (α-Si), low-temperature poly-silicon (LIPS) or zinc oxide, such as indium gallium zinc oxide (IGZO), 2 to 4 additional compensation transistors are needed in the TFT circuitry in addition to the switching and driving transistors, depending on the type of products and applications.

Generally, a pixel of an AMOLED includes three to four sub-pixels, depending of the type of the applications and products. In the case where the pixel includes three sub-pixels, the three sub-pixels are respectively a red sub-pixel, a green sub-pixel, and a blue sub-pixel, which are referred to as RGB pixel. In the case where the pixel includes the fourth sub-pixel, a white sub-pixel, this is defined as WRGB pixel.

Dimensions of both the transistor of a TFT substrate and a sub-pixel of an AMOLED are factors in determining the resolution of an AMOLED. For example, if an AMOLED is required to have a resolution of about 2,000 ppi, the dimension of a pixel of the AMOLED is less than about 25.4 micrometer (μm). In a case where the pixel includes three sub-pixels, the dimension of each sub-pixel is about 25.4 μm divided by three, i.e., about 8.46 μm. Generally, a sub-pixel of an AMOLED includes three to six transistors, and two to three capacitors. If a sub-pixel with a dimension of 8.46 μm includes six transistors, the dimension of each transistor is required to be less than 1.41 μm. Due to limitations of the existing glass based thin-film manufacturing technology, it is unlikely to manufacture a transistor having a size less than 1.41 μm. That is, it is infeasible to propose an AMOLED device having a resolution of greater than 2,000 ppi, or higher, such as 2,000 ppi to 4,000 ppi. Moreover, both TFT and OLED adopt different technologies to define and manufacture the required resolution. The TFT uses the photolithography to define each of gate, source, and drain metal resolutions, while the OLED resolution is defined using a fine metal mask in a high vacuum deposition process. Even when the OLED manufacturing technology can overcome and achieve even higher resolution, the TFT resolution will become more critical since each of OLED sub-pixel is driven by more than 5 to 6 transistors.

Therefore, in one aspect of this invention is to propose a modified AMOLED device by forming the OLED layer on a substrate and forming the TFT circuit on another substrate or integrated into an IC chip or other devices so that the resolution issues of the TFT can be solved, and then bonding both OLED layer and TFT substrate together through a bonding process or a laminating process. As such, the modified AMOLED device will only need to deal with the resolution of the OLED and to resolve and improve the fine metal mask design rules in order to obtain a display resolution more than 2,000 ppi.

In addition, the performance of an AMOLED depends significantly on the performance of a channel material of a transistor of a TFT substrate. With current technology, the channel material of the transistor consists of α-Si, LTPS, or IGZO. The carrier mobility provided by α-Si is generally below about 10 $cm^2/(V·s)$, is below about 100 $cm^2/(V·s)$ for LTPS, and is below about 30 $cm^2/(V·s)$ for IGZO. These mobilities are well below that of the crystal Si, which is about 500 to 1,000 $cm^2/(V·s)$. Generally, for application of the existing AMOLED in the mobile phone products, LTPS is selected as a channel material of a transistor, and in a TV product, IGZO is selected as the channel material of a transistor. If the specification of the AMOLED reaches more than 128 fps and 16K TV and beyond for next wave applications, the existing channel materials no longer meet these requirements. Hence, another aspect of this invention is to propose a modified AMOLED, in which the OLED layer is formed on a substrate and the TFT circuit is integrated into an IC chip or other device that has the single crystal Si as the channel material and that is mounted or disposed on the substrate, so that the mobility of the TFT circuit can reach more than 500 $cm^2/(V·s)$.

Further, if the next-wave AMOLED is required to be fully transparent, the opaque features of both LTPS and α-Si channel materials and the three metals of source, drain, and gate in each transistor of the TFT substrate would make it infeasible to make a fully transparent AMOLED. Another problem for making fully transparent AMOLED arises due to the optical cavity effect from both TFT and OLED, if OLED layer sits directly on TFT substrate. The OLED layer has more than 7 layers with just one cathode being non-transparent. However, the TFT has more than 6 stacked layers with just one gate insulator being transparent. When simulate the optical cavity to calculate the light passing through and from the OLED layer and bounce back and forth, the design of transparency from each specific layer thickness and refractive index becomes very difficult when there are many absorption and reflective layers from the TFT.

Moreover, the future OLED display may be required to provide a brightness beyond 5,000 $cd/m^2$ (nits) for MR/AR applications and beyond 100,000 nits for autostereoscopic 3D displays, almost 10 to 200 times brighter than about 600 nits today. That means the photons generated by the OLED device will increase 10 to 200 times for each of red, green and blue sub-pixels. The intrinsic bandgap of channel materials of both α-Si and LTPS is about 1.1 eV, and the intrinsic bandgap of a channel material of IGZO is about 3.1 eV. The intrinsic bandgaps of α-Si, LTPS and IGZO are far less than the excited photon energy of the color pixels of red, green and blue when the OLED device emits a brightness beyond 5,000 to 100,000 nits. Under such high brightness, the channel materials of the TFT upon receiving the light from the OLED device can result in generation of additional free carriers along the channels of transistors, which results in significant noise and degrades the performance of the transistors. As a result, performance of the AMOLED is adversely affected. Hence, a further aspect of this invention is to propose a modified AMOLED that is formed by disposing the TFT outside of the active area of the AMOLED and that can permit OLED device to emit the light intensity more than 1,000,000 nits.

Furthermore, in order to achieve a higher performance, it is preferable to implement a PMOS or a CMOS in a TFT substrate for an AMOLED device. However, due to the limitations of existing thin-film semiconductor manufacturing technology, only NMOS can be easily formed with less photomask processes, and it is difficult to form a PMOS due to the intrinsic high level of hydrogen in a channel of a transistor, wherein hydrogen is created during the deposition processes of α-Si, LTPS, and IGZO. Since CMOS can be easily formed in the single crystal silicon substrate, it is preferable, according to yet another aspect of this invention, to form the TFT circuit in the Si substrate and form the OLED layer on another substrate so as to speed up and stabilize AMOLED display.

Current passive matrix OLED (PMOLED), AMOLED, and μOLED use different substrates for depositing OLED layer thereon. PMOLED is formed using a matrix addressed 4-mask soda lime glass as the substrate. AMOLED is formed using a boron silicate glass as the substrate with TFT already formed on the glass. And μOLED is formed using a Si wafer as the substrate (in which a white OLED is deposited on the Si wafer with all TFTs, control, driving, and other circuitries being formed on the Si wafer with typical semiconductor technologies). The cost of making PMOLED is the lowest due to its low cost of soda lime glass. Whereas, the cost of making AMOLED is higher due to the use of the expensive and complicated TFT substrate, as the yield killer factor comes from the process of integrating TFT and OLED. The existing μOLED has the highest cost due to the use of high cost of either 8- or 12-inch Si wafer as the substrate, and the lowest yield due to direct wet photo patterning of the color filter (CF) on the OLED device which is deposited on the Si wafer. Therefore, to form the OLED device on another substrate and then bond or laminate the OLED device to the TFT glass or Si wafer will significantly eliminate the yield killer factor and increase the yield as well as decrease the manufacturing costs. This bonding or lamination between two substrates significantly makes more easier the wiring between OLED device and underlying TFT glass or Si wafer with interconnections.

Existing VR/AR/MR and autostereoscopic 3D display adopt one of the digital light processing (DLP), liquid crystal on Si (LCos), or μOLED as the key element of the optical engine to project the color image from a tiny micro display into a projected virtual screen through a complicated optics. However, only μOLED can self-emit color light without the use of a backlight, which permits the μOLED to become the potential mainstream for the next wave VR/AR/MR and autostereoscopic 3D display applications for its superior light weight and simple optics design. Most of existing μOLEDs adopt CF as the color transformation layer deposited directly on top of a white OLED device, rather than using the RGB patterned OLED device, to directly emit the RGB color because of the CF being able to achieve a higher resolution than the RGB patterning. More specifically, formation of the CF normally adopts wet photo patterning process with a precision in the order of sub-micron, whereas RGB pattering uses the metal shadow mask with a precision in the order of few microns to form each RGB color during the OLED deposition process. Since the CF uses the wet photo process patterning directly on top of the film passivation and OLED layers to define the RGB color transformation area, the CF will bring detrimental effects to these underlying moisture-and-oxygen sensitive layers and cause a very low manufacturing yield. Hence, the structures and the processes of these existing low yield μOLED devices cannot convince nowadays VR/AR/MR and future autostereoscopic 3D display market to grow as expected.

The CF used in μOLED is normally a three-sub-pixel (RGB) color transformation layer formed by 4 wet photo mask processes. When irradiated with broad band white light from underlying white OLED device, the CF will transform each sub-pixel area to emit red, green, and blue. Alternatively, the white OLED can be replaced with a blue OLED, because blue OLED has a shorter wavelength and the blue light can be easily transformed to the color with lower wavelength of RGB. However, when the μOLED in use reaches a high brightness of more than 5,000 to 100,000 nits, the pigment-based. CF will generate heat sufficient to burn up the pigment, especially for those low efficient light transformation color pigments, as well as the adjacent binder. Therefore, for high brightness μOLED, the architecture of the CF based μOLED device needs to be modified so as to be suited for new products and applications. An alternative solution to this issue can use either quantum dot layer to replace CF as the color transformation layer or RGB direct patterning OLED in an ultra-thin substrate, such as ultra-thin glass (UTG) or polyimide (PI).

The quantum dot (QD) is made with direct bandgap semiconductor using bandgap engineering so as to reduce the size of the semiconductor in three-dimension down to nanometer scale to engineer the bandgap to emit different wavelength based on the principle of the quantum confinement effect. When irradiated and excited by the light with shorter wavelength from the underlying blue OLED, each of red, green, and blue QD will emit individual RGB color when the excited electrons jump to the conductive bands to recombine the holes in the valence bands. These bandgaps of RGB are determined by the quantum confinement effect by tailing and controlling the QD size of these semiconductors. The light efficiencies of these QDs, transferring directly from the jumping and recombination of the electrons, are expected to be higher than that of the pigment-based CF, and hence can emit much higher brightness than the pigment-based CF. Therefore, unlike the pigment-based CF transformation layer, the QD layer can endure high brightness without being burned up.

The RGB direct patterning is normally used to make AMOLED for small panels, such as mobile phones of less than 7 inches with resolution below 600 ppi based on G6 substrate size (1,850×1500 mm). Since RGB direct patterning uses the fine metal mask to define each RGB color, it has the highest efficiency and will be the best candidate for the high brightness AMOLED applications. For μOLED, the substrate is a Si wafer with a dimension of either 8 or 12 inches, that is much smaller than G6 glass, which allows much more easier implementation of the fine and thin metal mask in the Si semiconductor technology for RGB patterning, which, in turn, permits the RGB patterning to achieve a sub-micron scale, so that the resolution of the μOLED can reach more than 2,000 ppi.

According to yet another aspect of this invention, the modified AMOLED is formed by independent forming the TFT and the OLED in different substrates and then directly bonding together the TFT substrate and the OLED substrate. The direct bonding is defined throughout the entire disclosure as one that two substrates, having the same or different materials, are firmly bonded together without any intermediate additive of gluing or adhesive medium. In order to accomplish the direct bonding, at least one of the two substrates is subjected to surface activation through surface modification techniques, such as plasma, ion or electron activation, so that the fresh surfaces of the two substrates can react with each other to form chemical bonds therebetween, by which the two substrates can be bonded together. Two substrates, particularly for glass to glass, may be bonded together indirectly through an intermediate gluing layer, such as the optically clear adhesive (OCA) or optically clear resin (OCR). However, the use of the intermediate gluing layer can be problematic. Firstly, it is extremely difficult to handle an ultra-thin substrate carried with the adhesive due to the sticky property of the adhesive during direct bonding of the two substrates. In the meanwhile, the high brightness of the next wave applications, such as AR/MR and autostereoscopic 3D display, can degrade significantly the adhesive, such as yellowing and risk of generating undesired cavities or bubbles, and even cause burning up due to a large amount of heat resulting from the high brightness. Moreover, the adhesives have a tendency of releasing corrosive substances that are harmful to the OLED devices, particularly when exposed to the high heat or radiation condition due to the high brightness OLED displays. Furthermore, the gluing or adhesive layer of the intermediate medium, such as the OCA and OCR, normally has a thickness greater than 50 microns, since the smaller the harder to handle the adhesive during bonding process. As a consequence, the gluing or adhesive layer with such thickness can cause adverse effects, such as undesired light leakage, scattering, diffusing, and/or absorption, on the applications of high brightness OLED devices.

In summary, with the existing architecture, the AMOLED performance is limited by the TFT semiconductor manufacturing technology and OLED vacuum deposition with fine metal mask on a glass substrate as well as by the integration of a TFT driving plane with an OLED front plane. In the meantime, based on the architecture of existing µOLED, the manufacturing yield thereof is very low due to the wet photo patterning of CF formed directly on the passivation layer which is to protect the underlying water and oxygen sensitive white OLED layers. Moreover, the pigment-based CF cannot withstand the heat resulting from a high brightness OLED greater than 5,000 to 100,000 nits. To achieve the goal of higher performance of AMOLED and µOLED devices for brightness and resolution, in particular for next wave display applications, such as AR and MR and autostereoscopic 3D display, the present disclosure will address at least one of the above issues.

Figure 3:
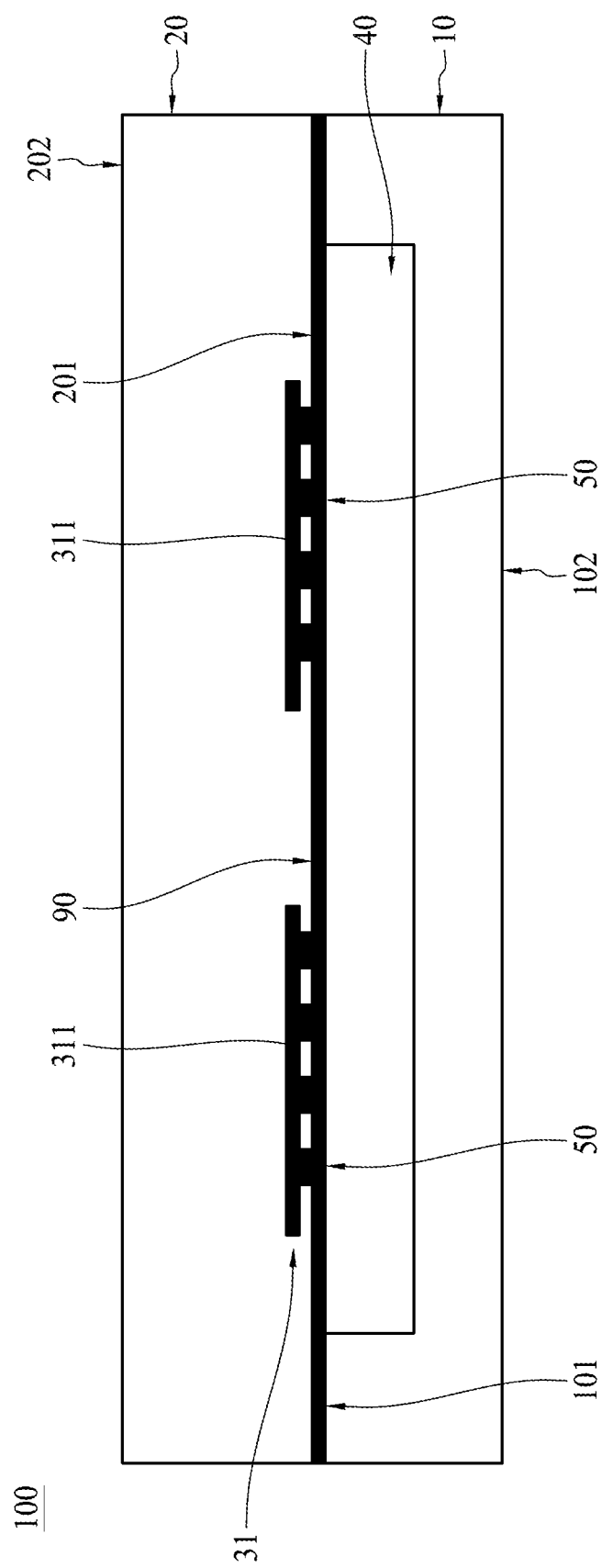
FIG. 3 is a schematic view of an OLED device in accordance with some embodiments of the present disclosure.
Figure 4:
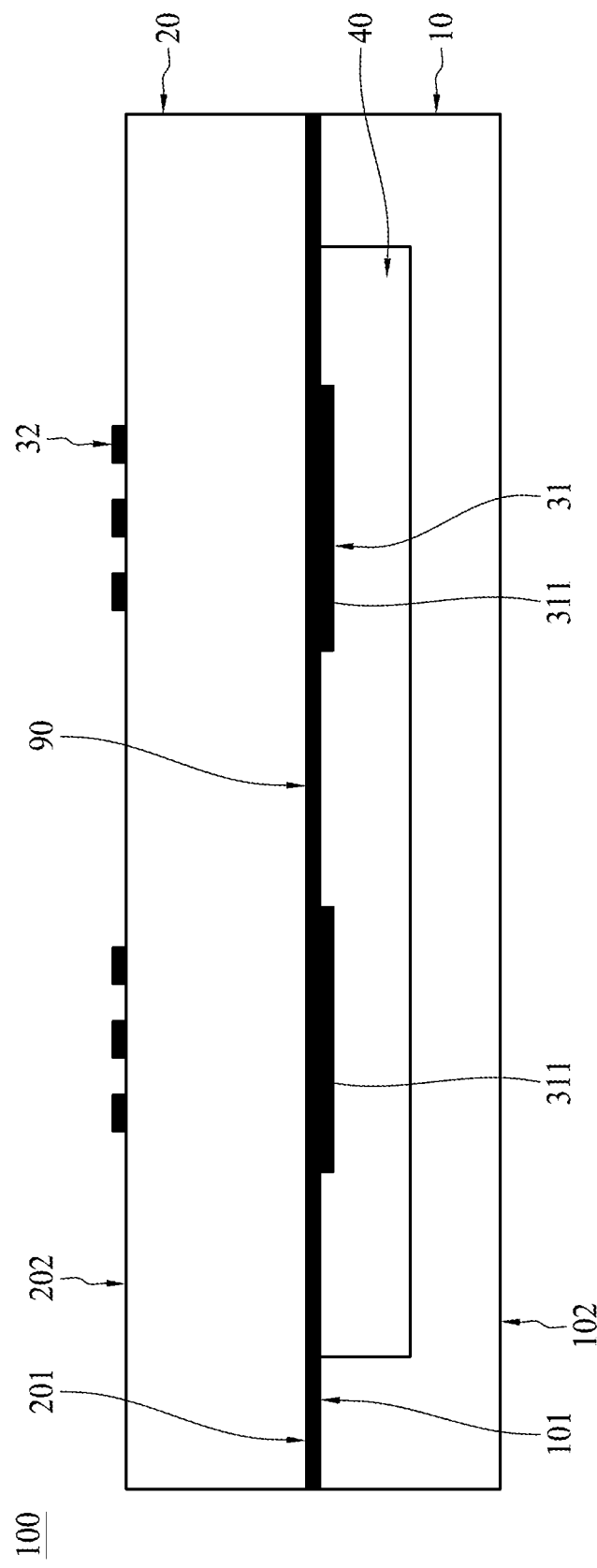
FIG. 4 is a schematic view of another OLED device in accordance with some embodiments of the present disclosure.

FIGS. 3 and 4 are schematic views of an OLED device 100 according to some embodiments of the present disclosure. The OLED device 100 includes: a first substrate 10 having a bonding surface 101 and a mounting surface 102 opposite to the bonding surface 101; a second substrate 20 having opposite first and second surfaces 201, 202; a coloring unit including an OLED layer 31 and optionally a color-transformation layer 32, the OLED layer 31 being formed on the second substrate 20 when the coloring unit is free of the color-transformation layer (see FIG. 3), the OLED layer 31 being formed on the first substrate 10 and the color-transformation layer 32 being formed on the second substrate 20 when the coloring unit includes the color-transformation layer 32 (see FIG. 4); and a pixel circuit 40 of TFT or CMOS with pixel driving and controlling functions formed on the first substrate 10 and coupled to the OLED layer 31 for controlling emission of each sub-pixel of the OLED layer 31. The bonding surface 101 of the first substrate 10 and the first surface 201 of the second substrate 20 are in direct bonding without any intermediate additive of gluing or adhesive layer.

In some embodiments, the architectures of FIGS. 3 and 4 are constructed in a manner suited for making µOLEDs, whereas in other embodiments, the architectures of FIGS. 3 and 4 are constructed in a manner suited for making AMOLEDs.

Figure 5:
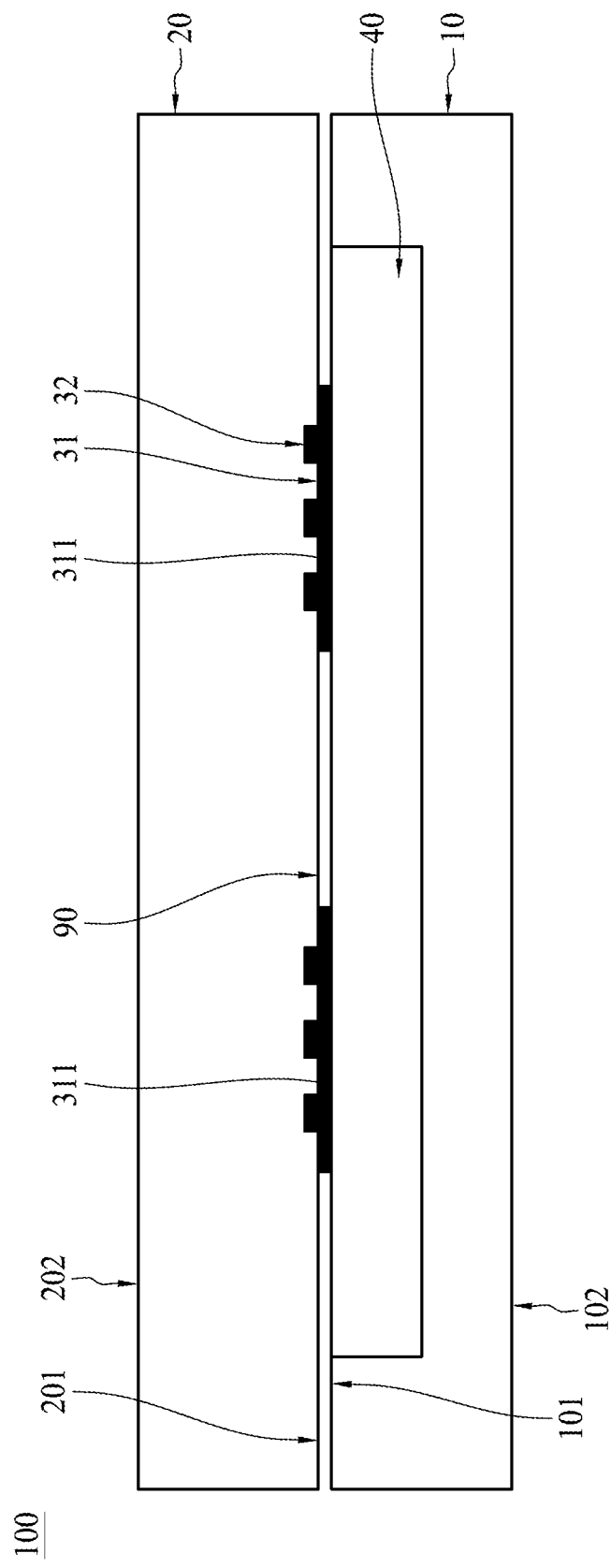
FIG. 5 is a schematic view of further another OLED device in accordance with some embodiments of the present disclosure.
Figure 6:
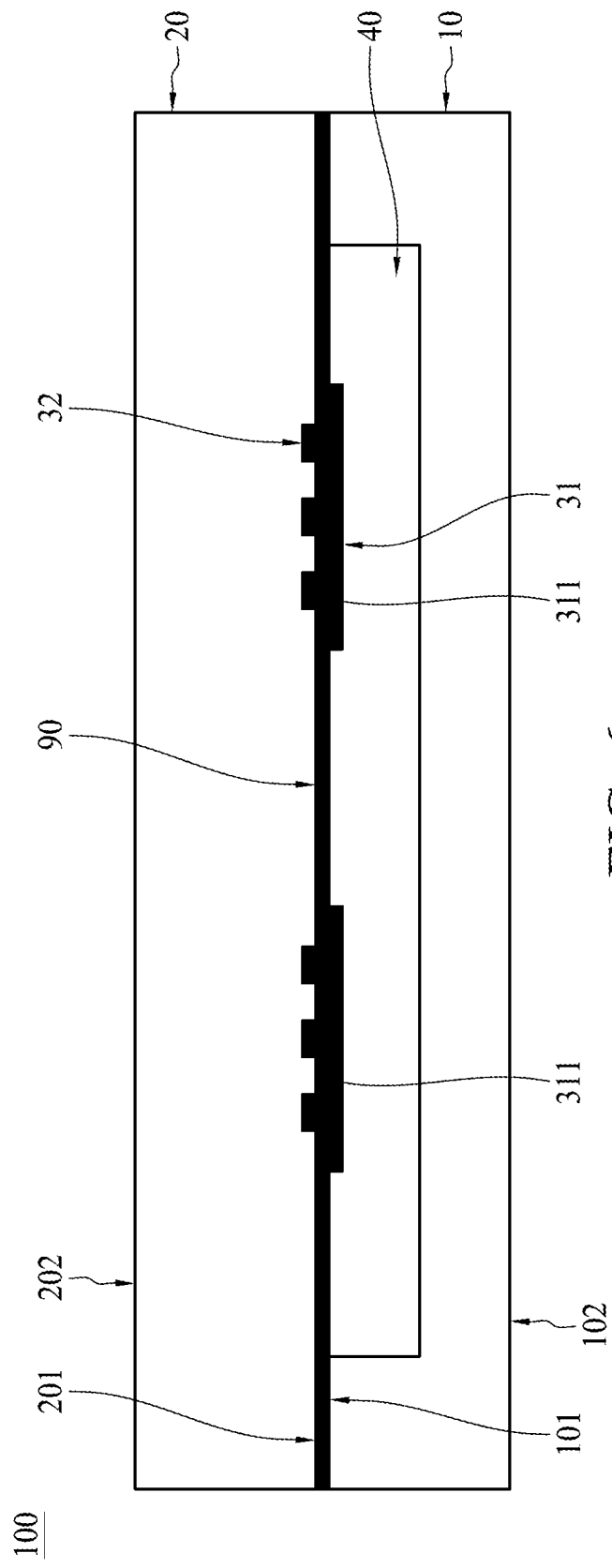
FIG. 6 is a schematic view of further another OLED device in accordance with some embodiments of the present disclosure.

Alternatively, FIGS. 5 and 6 are schematic views of an OLED device 100 according to some embodiments of the present disclosure. The OLED devices 100 of FIGS. 5 and 6 have structures similar to that of FIG. 4. In FIG. 5, the OLED layer 31 and the color-transformation layer 32 are both formed on the first surface 201 of the second substrate 20, in which the color-transformation layer 32 is formed before the OLED layer 31 is deposited on the first surface 201 of the second substrate 20. Whereas in FIG. 6, the OLED layer 31 is formed on the bonding surface 101 of the first substrate 10 and the color-transformation layer 32 is formed on the first surface 201 of the second substrate.

The OLED layer 31 includes a plurality of pixels 311. For clarity, only two pixels 311 are illustrated. The pixel 311 includes a plurality of sub-pixels (not shown). In some embodiments, the pixel includes a green sub-pixel, a blue sub-pixel, and a red sub-pixel. In some embodiments, each sub-pixel includes anode and cathode electrode layers (not shown) and a middle layer structure (not shown) disposed between the two electrode layers. Materials of the two electrode layers and the middle layer structure are appropriately selected to perform the desired emission.

In some embodiments, the middle layer structure, for example, includes a hole injection sub-layer (HIL), a hole transportation sub-layer (HTL), an emission sub-layer (EL), an electron transportation sub-layer (ETL), and optionally an electron injection sub-layer (EIL). The HIL functions for hole injection from an anode of the OLED layer 31. The HTL functions for hole transport from the HIL to the EL. The EL is a layer where an electron and a hole are recombined to form an exciton, which generates light emission with various colors such as red, green, and blue. The ETL functions for electron transport from the EIL and the cathode to the EL.

In some embodiments, the pixel circuit 40 includes a plurality of transistors, capacitors, and other active or passive electrical components (not shown) so as to provide TFT functions. The transistors are coupled to the sub-pixels of the OLED 31 layer through interconnections (not shown) for controlling emission of the sub-pixels.

In some embodiments, the bonding surface 101 of the first substrate 10 and the first surface 201 of the second substrate 20 are subjected to plasma, ion, or electron activation treatment in the vacuum prior to the bonding or lamination. After the surface activation treatment, the bonding surface 101 is aligned with and contacts the first surface 201 under pressure so as to permit formation of an interlayer 90 of chemical bonding between the bonding surface 101 and the first surface 201. This process is defined as direct bonding with the thickness of interlayer 90 less than 10 nanometers and compositions of the interlayer 90 containing at least one or two elements same as the materials of the first and second substrates. That means if the first substrate is Si wafer and the second substrate is glass, then the main compositions of the interlayer 90 are $SiO_xY_z$ with Y being other metal and/or other nitrogen species since the main composition of Si wafer is pure Si and the glass is $SiO_x$ with x closed to 2. The element Y may be the implemented impurities from the vacuum surface activation treatment or intentionally added from the surface activation target materials to enhance the direct bonding strength.

In some embodiments, the first substrate 10 is a silicon wafer, an ultra-thin glass (UTG) substrate, or an ultra-thin wafer (UTW) substrate, and the second substrate is a UTG substrate, a UTW, or UTP (ultra-thin polyimide). The thickness of the term "ultra-thin" is defined as one that is less than 100 µm. Preferably, the thickness of the UTG is less than 50 µm. The use of the UTG for the second substrate 20 in direct bonding with the first substrate 10 eliminates the passivation multilayer as required by the conventional AMOLED devices or µOLED devices for protecting the OLED from the exposure to moisture and oxygen and another detrimental environment.

In some embodiments, as shown in FIG. 3, the first substrate 10 is a silicon wafer, the second substrate 20 is a UTG substrate, the coloring unit is free of the color-transformation layer, and the OLED layer 31 is formed on the first surface 201 of the second substrate 20. This OLED layer 31 can be simply a type of bottom emission OLED. A plurality of conductive pads 50 are formed on the OLED layer 31 and are electrically connected to the pixel circuit 40 on the first substrate 10 and the OLED layer 31 on the second substrate 20.

In some embodiments, as shown in FIG. 4, the first substrate 10 is a silicon wafer, the second substrate 20 is a UTG substrate, and the coloring unit includes the color-transformation layer 32. The OLED layer 31 is formed on the bonding surface 101 of the first substrate 10, and the color-transformation layer 32 is formed on the second surface 202 of the second substrate 20. Alternatively, the color-transformation layer 32 may be formed on the first surface 201 of the second substrate 20.

In some embodiments, the OLED layer 31 is a white OLED, and the color-transformation layer 32 is RGB pigment-based color filter. In some, embodiments, the OLED layer 31 is a blue OLED, and the color-transformation layer 32 is a quantum dot layer.

Figure 7:
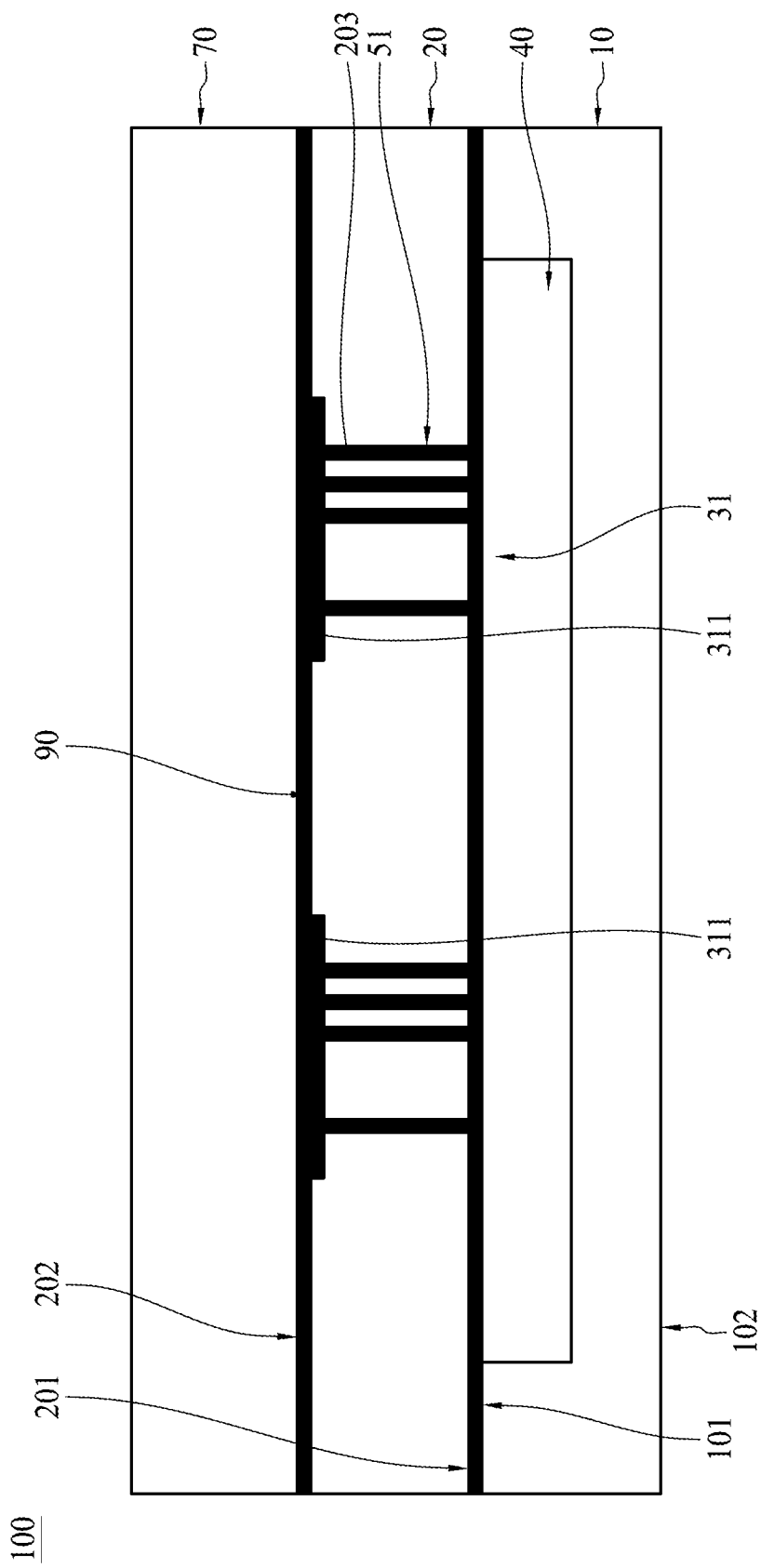
FIG. 7 is a schematic view of further another OLED device in accordance with some embodiments of the present disclosure.

FIG. 7 is a schematic view of an OLED device 100 according to some embodiments of the present disclosure. The OLED device 100 has a structure different from that of FIG. 3. In particular, as shown in FIG. 7, the OLED layer 31 is formed on the second surface 202 of the second substrate 20, the pixel circuit 40 is formed on the first substrate 10 of a silicon wafer, a plurality of via holes 203 are formed in the second substrate 20 and extending through the first and second surfaces 201, 202, and a plurality of conductive interconnects 51 extending through the via holes 203 to connect the pixel circuit 40 to the OLED layer 31. A third substrate 70 of a UTG covers and is in direct bonding with the second surface 202 of the second substrate 20 without any intermediate additive of gluing or adhesive layer. The pixel circuit 40 is electrically connected to the OLED layer 31 through the conductive interconnections 51.

In some embodiments, when the resolution of the glass-based AMOLED device is required to be so high that each sub-pixel contact has a dimension of less than 5 μm, the diameter of the via hole formed in the UTG is also needed to be correspondingly less than 5 μm. According to the aspect ratio rule, the thickness of the UTG is better to be less than 15 to 25 μm in order to form the via holes in the UTG substrate. Whereas, for the μOLED made with Si wafer, the contact hole will be less than 1 μm, as such, the thickness of the UTG will be less than 3 to 5 μm. Hence, in some embodiments, a high-resolution OLED device can be realized or improved by using the UTG substrate and the conductive interconnections 51.

Figure 8:
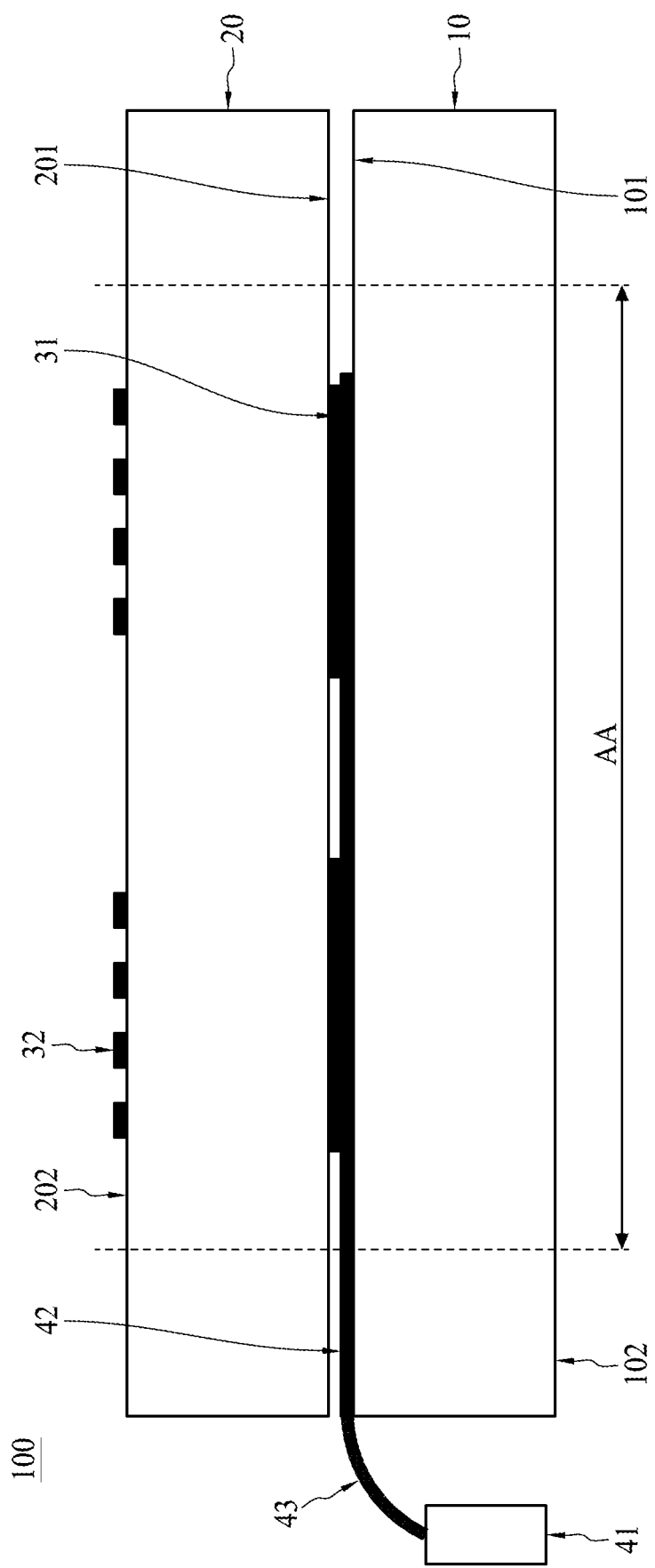
FIG. 8 is a schematic view of yet another OLED device in accordance with some embodiments of the present disclosure.

FIG. 8 is a schematic view of an OLED device 100 according to some embodiments of the present disclosure. The OLED device 100 has a structure different from that of FIG. 3. In particular, the pixel circuit 40 includes an IC chip 41, a flexible printed circuit (FPC) 43, and a plurality of conductive lines 42 that are formed on the bonding surface 101 of the first substrate 10. Each of the first 10 and second substrates 20 is a UTG substrate. The OLED layer 31 is formed on the first surface 201 of the second substrate 20 and the IC chip 41 is disposed on the first substrate 10 outside of the active area (AA) of the OLED device 100 and is connected electrically to the OLED layer 31 through the conductive lines 42 and the FPC 43 for controlling emission of the OLED layer 31. A color-transformation layer 32 is formed on the second surface 202 of the second substrate 20. The IC chip 41 includes transistors, capacitors and active and passive components (not shown) having TFT functions for controlling the emission of the OLED layer 31. Since the IC chip 41 is disposed outside of the active area, the high density layout of the metal source, gate, and drain of the transistors can avoid the blocking of the light and the channels of the gates can avoid the carrier generation from the high brightness of the OLED layer 31. Alternatively, the color-transformation layer 32 also can be formed on the first surface 201 of the second substrate 20 before the OLED layer 31 is deposited.

Figure 9:
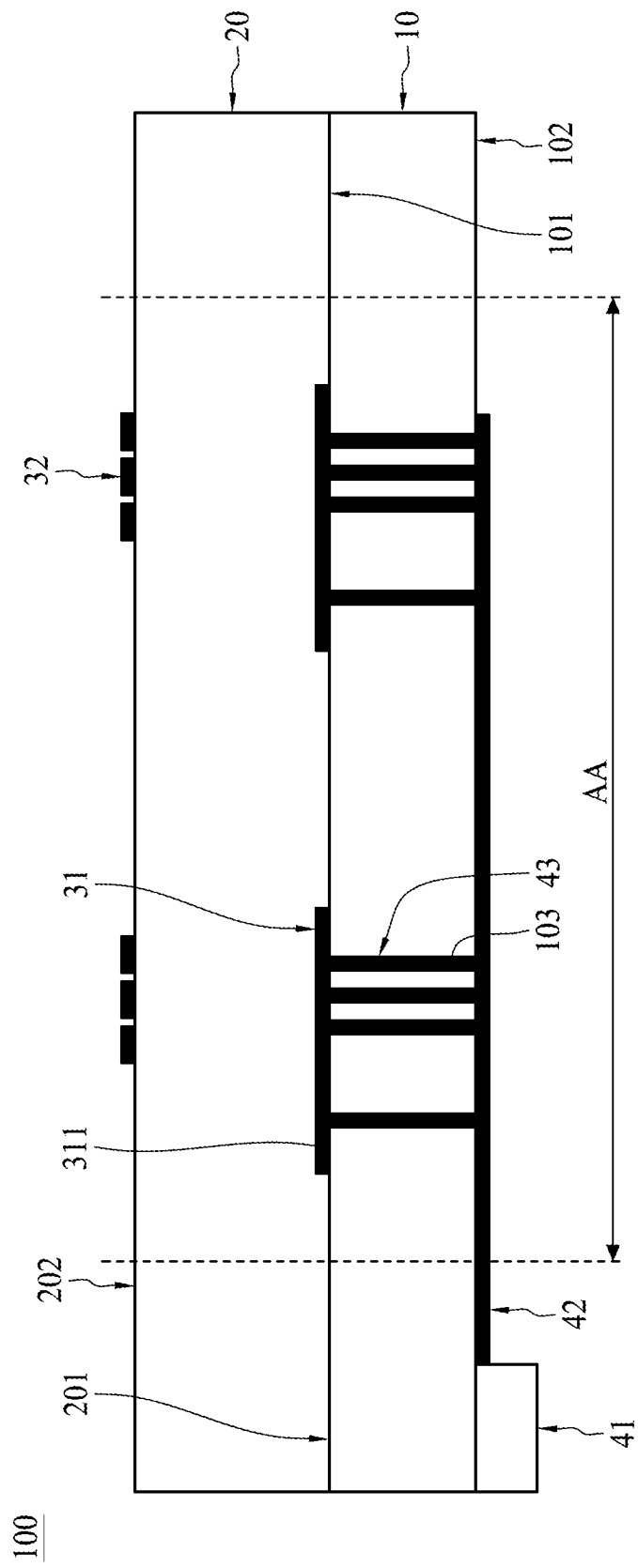
FIG. 9 is a schematic view of yet another OLED device in accordance with some embodiments of the present disclosure.

FIG. 9 is a schematic view of an OLED device 100 according to some embodiments of the present disclosure. The OLED device 100 has a structure different from that of FIG. 7. In particular, the pixel circuit 40 includes an IC chip 41, a plurality of conductive lines 42, and a plurality of conductive interconnections 43. Each of the first 10 and second substrates 20 is a UTG substrate. The first substrate 10 is formed with a plurality of via holes 103 extending through the bonding surface 101 and the mounting surface 102. The conductive interconnections 43 extend through the via holes 103 and the conductive lines 42 are formed on the mounting surface 102 of the first substrate 10 to connect respectively to the conductive interconnections 43. The OLED layer 31 is formed on the first surface 201 of the second substrate 20. And the IC chip 41 is disposed on the first substrate 10 outside of the active area of the OLED device 100 and is connected electrically to the OLED layer 31 through the conductive lines 42 and the conductive interconnections 43 for controlling emission of the OLED 10. A color-transformation layer 32 is formed on the second surface 202 of the second substrate 20. Alternatively, the color-transformation layer 32 also can be formed on the first surface 201 of the second substrate 20 before the OLED layer 31 is deposited.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. An organic light-emitting diode (OLED) device, comprising:
   a first substrate having a bonding surface;
   a second substrate having a first surface;
   a coloring unit including an OLED layer and optionally a color transformation layer;
   the OLED layer being formed on a selected one of the first and second substrates and the optional color-transformation layer being formed on the second substrate; and
   a pixel circuit with pixel driving and controlling functions disposed on the first substrate and coupled to the OLED layer for controlling emission of each sub-pixel of the OLED layer;
   wherein the bonding surface of the first substrate and the first surface of the second substrate are in direct bonding; and
   wherein the pixel circuit includes an IC chip and a plurality of conductive lines that are formed on the bonding surface of the first substrate, each of the first and second substrates being a UTG substrate, the OLED layer being formed on the first surface of the second substrate, the IC chip being disposed on the first substrate outside of the active area of the OLED device and being connected electrically to the OLED layer through the conductive lines for controlling emission of the OLED layer.

2. The OLED device of claim 1, further comprising a plurality of conductive pads that are formed on the OLED layer and that are electrically connected to the pixel circuit.

3. The OLED device of claim 1, wherein the second substrate further has a second surface opposite to the first surface and the color-transformation layer is formed on the second surface of the second substrate.

4. The OLED device of claim 1, wherein the color-transformation layer is a pigment-based color filter or a quantum dot layer.

5. The OLED device of claim 1, wherein the OLED layer is a white OLED, and the color-transformation layer is a pigment-based color filter.

6. The OLED device of claim 1, wherein the OLED layer is a blue OLED, and the color-transformation layer is a quantum dot layer.

7. The OLED device of claim 1, wherein
the pixel circuit further includes a plurality of conductive interconnections;
the first substrate further having a mounting surface opposite to the bonding surface and being formed with a plurality of via holes extending through the bonding surface and the mounting surface;
the conductive interconnections extending through the via holes;
the conductive lines being formed on the mounting surface of the first substrate to connect respectively to the conductive interconnections.

8. The OLED device of claim 1, wherein the direct bonding without any glue and adhesive medium generates an interlayer of chemical bonding between the bonding surface of the first substrate and the first surface of the second substrate, wherein the interlayer is less than 10 nm.

* * * * *